（12) United States Patent
Holzmann (10) Patent No.: US 10,044,346 B2
(45) Date of Patent: Aug. 7, 2018

(54) LOW-POWER SLEW RATE DETECTOR FOR EDGE RATE CONTROL OF AN OUTPUT POWER STAGE

(71) Applicant: Nuvoton Technology Corporation, Hsinchu (TW)

(72) Inventor: Peter J. Holzmann, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 6 days.

(21) Appl. No.: 15/261,500

(22) Filed: Sep. 9, 2016

(65) Prior Publication Data
US 2018/0076802 A1   Mar. 15, 2018

(51) Int. Cl.
| | |
|---|---|
| H03K 17/16 | (2006.01) |
| H03K 4/00 | (2006.01) |
| H03K 5/12 | (2006.01) |
| H03F 3/45 | (2006.01) |
| G05F 3/02 | (2006.01) |
| H03K 17/687 | (2006.01) |
| H03K 5/04 | (2006.01) |
| G11C 27/02 | (2006.01) |
| H03K 7/08 | (2006.01) |

(52) U.S. Cl.
CPC ............... H03K 5/04 (2013.01); G11C 27/02 (2013.01); H03K 7/08 (2013.01)

(58) Field of Classification Search
CPC .......... H03K 5/04; H03K 7/08; H03K 17/687; H03K 19/003; G11C 27/02

USPC .................................................. 327/164–180
See application file for complete search history.

(56) References Cited

U.S. PATENT DOCUMENTS

| | | | | |
|---|---|---|---|---|
| 4,800,339 | A * | 1/1989 | Tanimoto | H03F 3/3001 330/253 |
| 5,596,297 | A * | 1/1997 | McClure | G05F 3/262 327/530 |
| 5,666,045 | A * | 9/1997 | Grodevant | H01S 5/042 323/282 |
| 5,886,554 | A * | 3/1999 | Corsi | H03K 19/00361 327/103 |
| 6,332,661 | B1 * | 12/2001 | Yamaguchi | G09G 3/3216 326/82 |
| 2004/0189362 | A1 * | 9/2004 | Callahan, Jr. | H03K 4/502 327/170 |
| 2014/0104000 | A1 * | 4/2014 | Gerstenhaber | H03F 1/3211 330/257 |

* cited by examiner

*Primary Examiner* — Brandon S Cole (74) *Attorney, Agent, or Firm* — Kilpatrick Townsend & Stockton (57) ABSTRACT

A circuit for determining a slew rate of an input signal includes a first MOSFET, a second MOSFET, and a resistor coupled in series between a ground terminal and a power terminal. The resistor is coupled between the power terminal and the second MOSFET, and the first MOSFET is coupled between the second MOSFET and the ground. The second MOSFET is coupled to a bias circuit to provide a bias current. The circuit also includes a capacitor having a first terminal and a second terminal, the first terminal coupled to the input signal and the second terminal coupled to the gate terminal and the drain terminal of the first MOSFET. A current flowing through the MOSFET during changes in the input signal represents a slew rate of the input signal.

15 Claims, 6 Drawing Sheets

LOW-POWER SLEW RATE DETECTOR FOR EDGE RATE CONTROL OF AN OUTPUT POWER STAGE

BACKGROUND OF THE INVENTION

This invention relates to the field of semiconductor circuit technologies. More particularly, some embodiments of this invention are directed to low-power slew rate detector circuits. In some embodiments, the slew rate detection circuits are used in class-D output power stages for edge rate control. However, the circuits can be used in any applications where accurate slew rate detection is desired.

Figure 1:
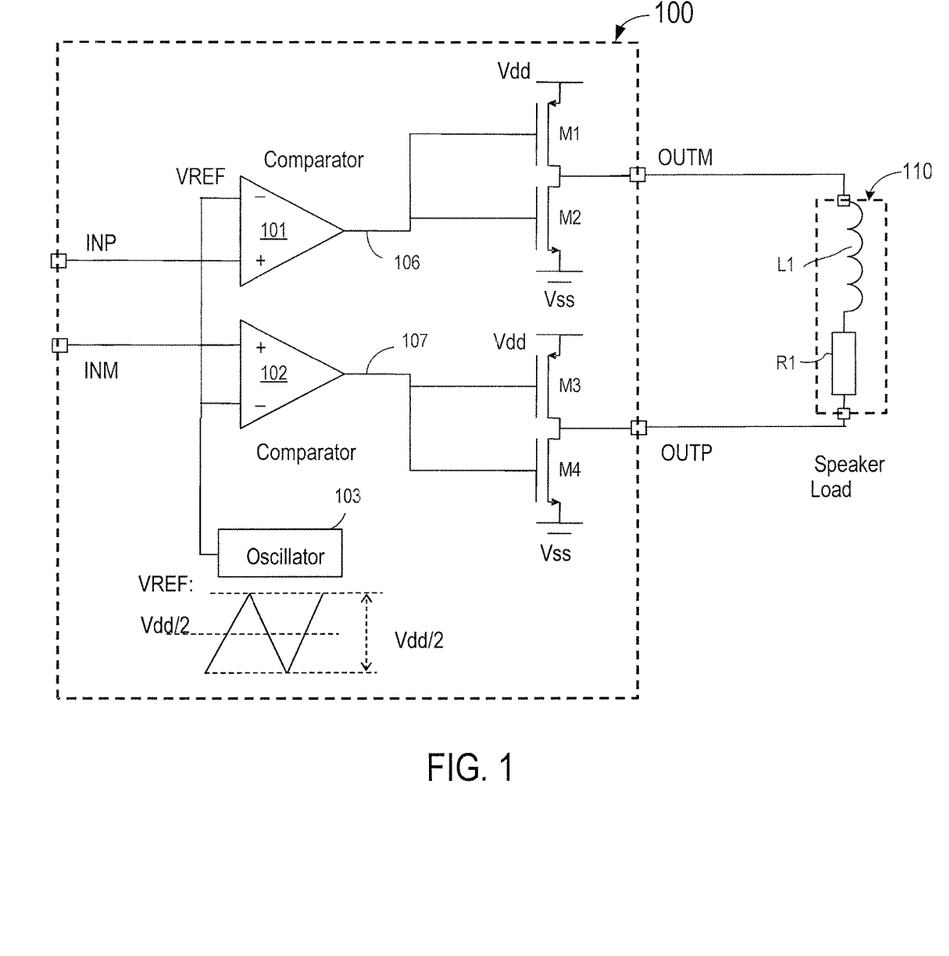
FIG. 1 is a schematic diagram illustrating a class-D audio amplifier coupled to a slew rate circuit according to an embodiment of the present invention.
Figure 2:
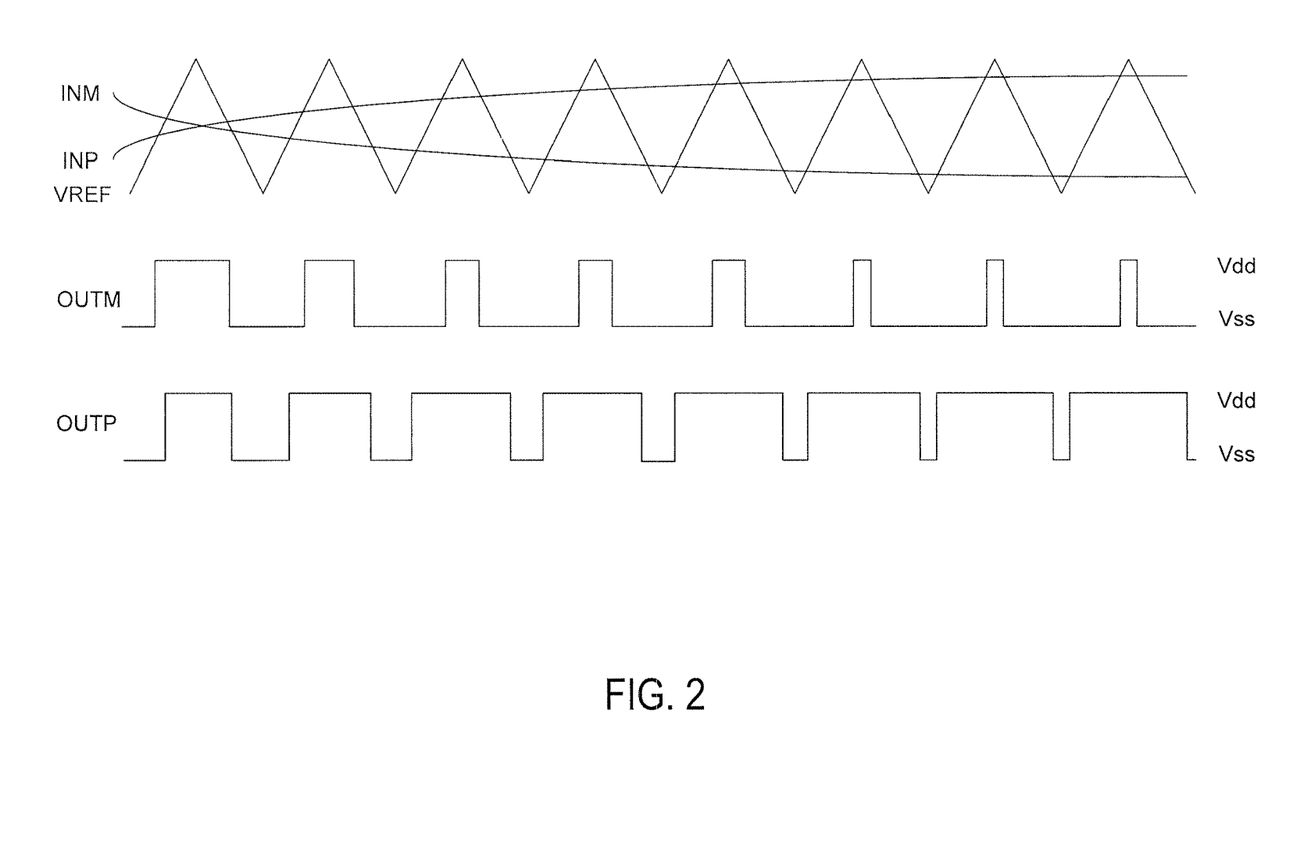
FIG. 2 is a waveform diagram illustrating an example of waveforms in class-D audio amplifier according to an embodiment of the present invention.

In Class-D Audio amplifiers, the output signal is a Pulse Width Modulated (PWM) waveform, which drives the external speaker. Such Pulse Width Modulated Waveform looks very much like a square wave and therefore, it has significant high-frequency content that can disturb and interfere with other circuits using radio frequencies much higher than the PWM frequency. Below is shown a typical configuration of a first order Class-D stage and its input and output waveforms. FIG. 1 and FIG. 2.

A class-D amplifier, sometimes known as a switching amplifier, is an electronic amplifier in which all transistors operate as binary switches. They are either fully on or fully off. CLASS-D amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, significantly reducing overall system costs, size, and weight.

Class D audio power amplifiers convert audio signals into high-frequency pulses that switch the output in accordance with the audio input signal. Some class D amplifiers use pulse width modulators (PWM) to generate a series of conditioning pulses that vary in width with the audio signal's amplitude. The varying-width pulses switch the power-output transistors at a fixed frequency. Other class D amplifiers may rely upon other types of pulse modulators. The following discussion will mainly refer to pulse width modulators, but those skilled in the art will recognize that class D amplifiers may be configured with other types of modulators.

FIG. 1 is a schematic diagram illustrating a class-D audio amplifier coupled to a slew rate circuit according to an embodiment of the present invention;

FIG. 1 shows a simplified schematic diagram illustrating a conventional class-D amplifier 100. The differential input audio signals INP and INM are input to comparators 101 and 102, where input signals INP and INM are compared with triangular waves VREF generated from an oscillator 103 to generate PWM signals 106 and 107. PWM signals 106 and 107 are coupled to the gates of transistors M1, M2, M3, and M4, respectively. Differential output signals OUTM and OUTP of the class D amplifier are respectively provided at terminals also labeled OUTM and OUTP. As shown in FIG. 1, output signals OUTM and OUTP are connected to a speaker load 110, which is represented by an inductor L1 and a resistor R1.

The traditional class D amplifiers have differential outputs (OUTP and OUTM) wherein each output is complementary and has a swing range from ground Vss to Vdd. The disadvantage of class-D amplification lies in the high frequency switching noise that is produced by the switching. This high frequency noise often resulted in EMI (Electronic-Magnetic Interference).

FIG. 2 is a waveform diagram illustrating the modulation of signals in the class-D amplifier of FIG. 1. As shown in FIG. 2, differential input signals, e.g., audio signals INM and INP, are compared with a triangular reference waveform VREF by two comparators as described above in connection with FIG. 1. The output signals of the comparators are pulse signals at a fixed frequency whose pulse width is proportional to the input signal. Two PWM signals are shown in FIG. 2 as OUTP and OUTM. The fast edges on the signals OUTP and OUTM can cause electromagnetic interference (EMI).

Figure 3:
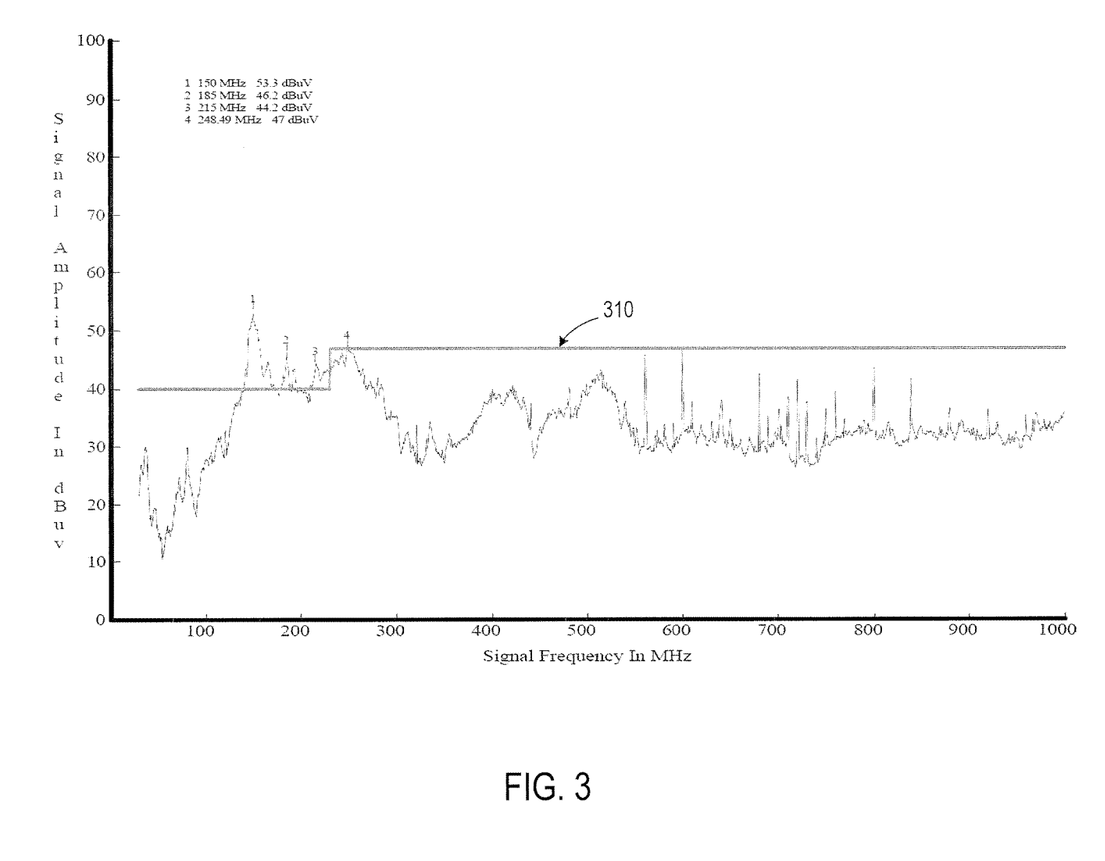
FIG. 3 is a diagram illustrating an example of EMI measurement of a class-D audio amplifier according to an embodiment of the present invention.

FIG. 3 is a diagram illustrating an example of EMI measurement of a class-D audio amplifier according to an embodiment of the present invention. The fast edges on the signals OUTP and OUTM can cause interference in the frequency range of 30 MHz to 1 GHz. FIG. 3 shows the result of a typical EMI test on a Class-D amplifier with a speaker load. The test is carried out in a test chamber, in which EMI signals are received at an antenna placed at a certain distance away from a device under test. As can be seen in FIG. 3, high frequency tones between 100 MHz and 600 MHz exceed the compliance mark 310. Therefore, there is a need to control the edges of the output signals, such that the high frequency content is reduced. Such control can be achieved, for example, by slowing down the gate control of M1, M2, M3, & M4 in FIG. 1. However, the actual slew rate of the output signals will eventually still depend on the PCB capacitance on the nodes OUTM & OUTP, the process, and temperature variation of the Class-D amplifier circuit. Therefore, there is a need for a more accurate detection of the real time edge rate in order to adjust for PCB capacitance on the nodes OUTM & OUTP, the process, and temperature variation of the Class-D amplifier circuit.

Conventional methods have been proposed for determining the slew rate of a signal, but they are not satisfactory. For example, in one approach, the timing of the input voltage at two reference levels is measured. The slew rate is then derived from the time difference. This approach requires an accurate time base circuit and high speed timer. In another approach, a switched capacitor circuit is used to determine the slew rate. This circuit requires switches and voltage references at the input, which is not suitable for use with high voltage input signals and the switches can create glitches on the input signal. In yet another approach, the slew rate is detected using a trans-conductance amplifier and the target application is for PWM supply control. Due to the trans-conductance amplifier the circuit is more complex and this added complexity and delay makes it slower, so it is not suitable for fast edge control.

Therefore, an improved slew rate detection circuit is highly desirable.

BRIEF SUMMARY OF THE INVENTION

This invention relates to the field of semiconductor circuit technologies. More particularly, some embodiments of this invention are directed to low-power slew rate detector circuits. In some applications, the slew rate detection circuit can be used in class-D output power stages for edge rate control. The input voltage can be at a higher voltage, e.g., at 10 V or higher, from class D boost circuit. The slew rate detection circuit can operate at low voltage, e.g., at 3 V, and does not require high voltage transistors. In addition, the slew rate detection circuit does not need high and low reference voltages or switched capacitors. Embodiments of the invention can offer simpler circuit design that are more cost-effective than conventional circuits.

According to an embodiment of the present invention, a circuit for determining a slew rate of an input signal includes a resistor, a first MOSFET (Metal-Oxide-Semiconductor Field Effect Transistor), and a second MOSFET coupled in series between a power terminal and a ground terminal. The first MOSFET has a drain terminal, a gate terminal, and a source terminal. A first end of the resistor is coupled to the power terminal, a second end of the resistor is coupled to a first end of the second MOSFET, a second end of the second MOSFET is coupled to a drain terminal of the first MOSFET, and the source terminal of the first MOSFET is coupled to the ground terminal. The circuit also includes a capacitor having a first terminal and a second terminal, the first terminal coupled to the input signal and the second terminal coupled to the gate terminal and the drain terminal of the first MOSFET. The second MOSFET is coupled to a bias circuit to provide a bias current. A current flowing through the MOSFET during changes in the input signal represents a slew rate of the input signal.

In an embodiment, the bias circuit includes third, fourth, and fifth MOSFETs coupled in series between the power supply terminal and the ground terminal. The third MOSFET is coupled to the power supply terminal and configured to receive a bias voltage. The fourth and fifth MOSFETS are diode-connected. The gate of the fourth MOSFET is coupled to the gate of the second MOSFET.

In an embodiment, the circuit also includes a sample-and-hold circuit, which includes a switch coupled to the first resistor and a capacitor coupled to the switch.

In an embodiment, the switch is coupled to a timing circuit that is coupled to the input signal.

In an embodiment, the circuit also includes an ADC (Analog-to-Digital Converter) coupled to the sample-and-hold circuit for providing a digital value representing the slew rate.

According to another embodiment of the present invention, a slew rate detection circuit, comprising a capacitor connected between an input signal and a diode-connected first MOSFET (Metal-Oxide-Semiconductor Field Effect Transistor). The first MOSFET is configured to carry a current during changes of an input signal and the current is proportional to the slew rate of the input signal.

In an embodiment, the circuit also includes a resistor and a second MOSFET coupled with the first MOSFET in series between a power terminal and a ground terminal. The first MOSFET has a drain terminal, a gate terminal, and a source terminal. A first end of the resistor is coupled to the power terminal, a second end of the resistor is coupled to a first end of the second MOSFET, a second end of the second MOSFET is coupled to the drain terminal of the first MOSFET, the source terminal of the first MOSFET is coupled to the ground terminal, and the second MOSFET is coupled to a bias circuit to provide a bias current. The capacitor has a first terminal and a second terminal, the first terminal coupled to the input signal and the second terminal coupled to the gate terminal and the drain terminal of the first MOSFET. The slew rate of the input signal is related to the current flowing through the resistor in response to changes in the input signal.

In an embodiment, the bias circuit includes third, fourth, and fifth MOSFETs coupled in series between the power supply terminal and the ground terminal. The third MOSFET is coupled to the power supply terminal and configured to receive a bias voltage. The fourth and fifth MOSFETS are diode-connected. The gate of the fourth MOSFET is coupled to the gate of the second MOSFET.

In an embodiment, the circuit also includes a sample-and-hold circuit, which includes a switch coupled to the first resistor and a capacitor coupled to the switch.

In an embodiment, the switch is coupled to a timing circuit that is coupled to the input signal.

In an embodiment, the circuit also includes an ADC (Analog-to-Digital Converter) coupled to the sample-and-hold circuit for providing a digital value representing the slew rate.

In an embodiment, the circuit also has a second MOSFET coupled to the drain terminal of the first MOSFET, the second MOSFET being coupled to a bias circuit to provide the bias current.

In an embodiment, the bias circuit comprises third, fourth, and fifth MOSFETs coupled in series between the power supply terminal and the ground terminal. The third MOSFET is coupled to the power supply terminal and configured to receive a bias voltage, the fourth and fifth MOSFETS are diode-connected, and the gate of the fourth MOSFET is coupled to the gate of the second MOSFET.

In an embodiment, the comparator includes a sixth MOSFET coupled in series with the second MOSFET, a gate of the sixth MOSFET is coupled to the bias voltage. The comparator also includes seventh, eight, and ninth MOSFETs coupled in series between power and ground. A gate of the seventh MOSFET is coupled to the bias voltage, a gate of the eighth MOSFET is coupled to the gates of the second and fourth MOSFETs, and a gate of the ninth MOSFET is coupled to the gates of the first MOSFET.

According to an embodiment of the present invention, a slew rate detection circuit includes a capacitor connected between an input signal and a diode-connected first MOSFET (Metal-Oxide-Semiconductor Field Effect Transistor). The first MOSFET is configured to carry a current during changes of an input signal, and the current is proportional to the slew rate of the input signal. The slew rate detection circuit also includes a bias circuit for providing a bias current through the first MOSFET, and a comparator configured for providing differential outputs based on the current through the first MOSFET and representing the slew rate.

In an embodiment, the circuit also includes a second MOSFET coupled to the drain terminal of the first MOSFET, the second MOSFET being coupled to a bias circuit to provide the bias current.

In an embodiment, the bias circuit comprises third, fourth, and fifth MOSFETs coupled in series between the power supply terminal and the ground terminal. The third MOSFET is coupled to the power supply terminal and configured to receive a bias voltage, the fourth and fifth MOSFETS are diode-connected, and the gate of the fourth MOSFET is coupled to the gate of the second MOSFET.

In an embodiment, the comparator includes a sixth MOSFET coupled in series with the second MOSFET, a gate of the sixth MOSFET is coupled to the bias voltage. The comparator also includes seventh, eight, and ninth MOSFETs coupled in series between power and ground.
A gate of the seventh MOSFET is coupled to the bias voltage, a gate of the eighth MOSFET is coupled to the gates of the second and fourth MOSFETs, and a gate of the ninth MOSFET is coupled to the gates of the first MOSFET.

In an embodiment, the circuit also includes a first latch coupled to a first node between the second and sixth MOS- FET and a second latch coupled to a second node between the seventh and eighth MOSFET for providing slew rate control.

A further understanding of the nature and advantages of the present invention may be realized by reference to the remaining portions of the specification and the drawings.

DETAILED DESCRIPTION OF THE INVENTION

Figure 4:
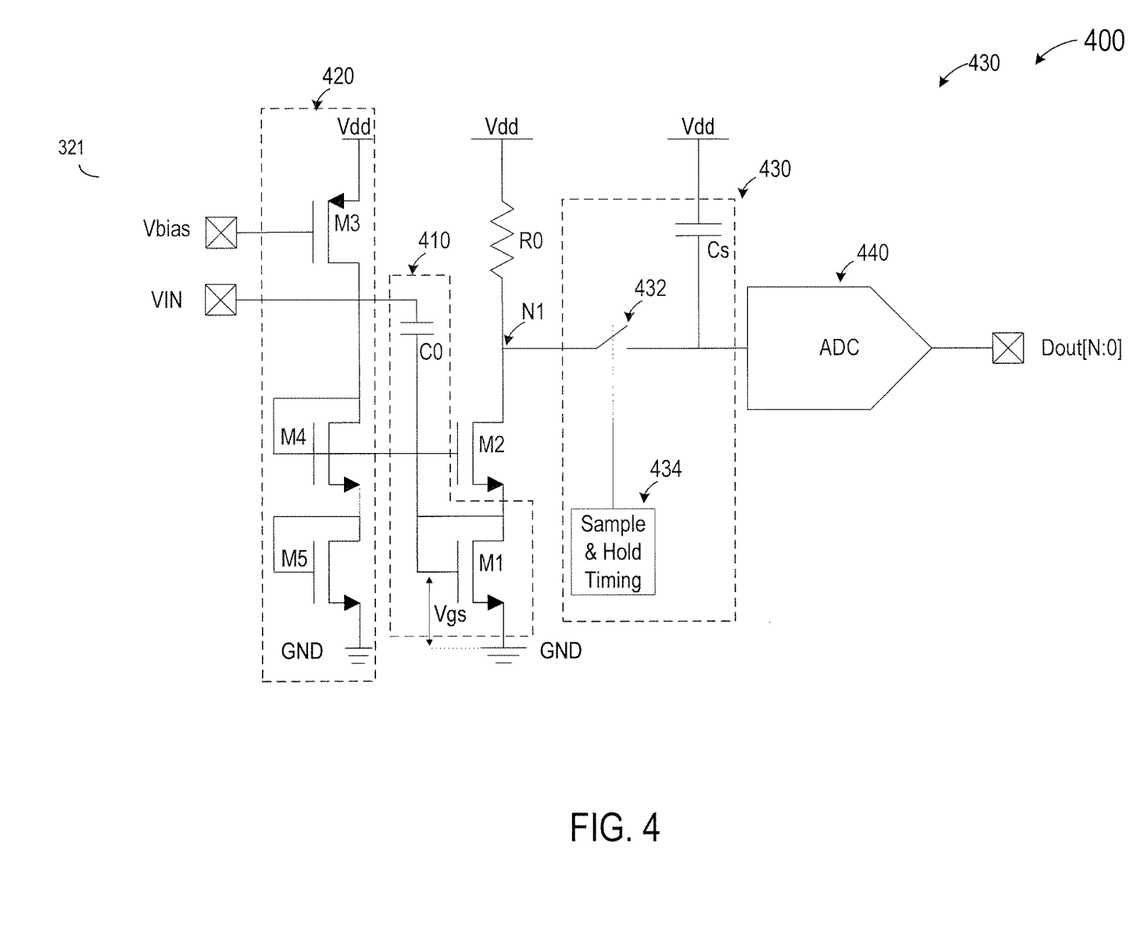
FIG. 4 is a schematic diagram illustrating a circuit for determining a slew rate according to an embodiment of the present invention.

FIG. 4 is a circuit diagram illustrating a slew rate detection circuit according to an embodiment of the present invention. As shown in FIG. 4, a slew rate detection circuit 400 includes a capacitor C0 connected between an input signal VIN and a diode-connected first MOSFET (Metal-Oxide-Semiconductor Field Effect Transistor) M1. As noted in FIG. 4, capacitor C0 and MOSFET M1 are enclosed in a dashed block 410. The first MOSFET M1 is configured to carry a current during changes of an input signal, and the current is proportional to the slew rate of the input signal VIN.

In this embodiment, slew rate detection circuit 400 also includes a resistor R0 and a second MOSFET transistor (M2) coupled with the first MOSFET in series between a power terminal Vdd and a ground terminal GND. The first MOSFET has a drain terminal, a gate terminal, and a source terminal, wherein a first end of the resistor is coupled to the power terminal Vdd, a second end of the resistor R0 is coupled to a first end of the second MOSFET M2 at a node N1, a second end of the second MOSFET M2 is coupled to the drain terminal of the first MOSFET, and the source terminal of the first MOSFET M1 is coupled to the ground terminal. Capacitor C0 has a first terminal and a second terminal, the first terminal coupled to the input signal VIN and the second terminal coupled to the gate terminal and the drain terminal of the first MOSFET. As explained below, the slew rate of the input signal is related to the current flowing through the resistor in response to changes in the input signal.

In FIG. 4, the second MOSFET transistor M2 is a second MOSFET coupled between the first resistor and the drain terminal of the first MOSFET M1, with the second MOSFET M2 being coupled to a bias circuit 420 to provide a bias current. Bias circuit 420 includes MOSFETs M3, M4, and M5 (also identified as third, fourth, and fifth MOSFETs) coupled in series between power supply terminal Vdd and the ground terminal GND. M4, the third MOSFET, is coupled to the power supply terminal and configured to receive a bias voltage Vbias. M4 and M5, the fourth and fifth MOSFETS, are diode-connected. The gate of M4 is coupled to the gate of M2, such that the current provided by M2 is the same as the current in M4, if the transistor dimensions are the same.

In some embodiments, slew rate detection circuit 400 also includes a sample-and-hold circuit 430, which includes a switch 430 coupled to the first resistor R0 and a capacitor Cs coupled to the switch. Sample-and-hold circuit 430 also includes a sample & hold timing circuit 434. In some embodiments, sample & hold timing circuit 434 can be coupled to input signal VIN. In some embodiments, an ADC (Analog-to-Digital Converter) 440 coupled to the sample-and-hold circuit 430 for providing a digital value Dout [N:0] representing the slew rate, where N is an integer.

As described above, slew rate detection circuit 400 includes a bias current transistor M3, which provides a bias current into diode-connected transistors M4 and M5. The gates of transistors M2 and M4 are tied together, which then results in a fixed ratio bias current Ib0 of M2 and diode-connected transistor M1. This current is forced into a resistor R0, resulting in a voltage $V_{R0}=Ib0 \times R0$ at a node N1 that can be sampled by an ADC (analog to digital converter). In some embodiments, transistors M1, M2, M4, and M5 can have the same dimension. Transistor M1 is diode-connected, with a bias current flowing to R0.

When the input VIN switches, a current will flow through capacitor C0. For example, When VIN goes up, it forces a current through C0, into M1, according to the relationship I=C*dv/dt, where dv/dt represents the slew rate. This current is added to current Ib0 through R0 In embodiments of the invention, the circuit is configured such that ΔVgs<<ΔVIN, where ΔVgs is the voltage drop between the gate and source of transistor M1. Since we are trying to measure the slew rate of the input signal, the change of Vgs can contributes an error of about Error=100×(1−(dVin−dVgs)/dVin) %. The maximum dVgs can be calculated depending on the tolerance requirements. As an example, for a 1% tolerance, dVgs needs to be less than 100 mV for a dVin of 10V. The condition Vgs<<ΔVIN can be satisfied if the VIN swing is large and the small signal impedance (1/gm) of M1 in parallel with (1/gm) of M2 is small. Under this condition, the current through C0 will be:

$$I_{C0} = C0 \times \frac{dVIN}{dt} = C0 \times SlewRate.$$

Then, when VIN is going from low to high, the voltage across R0 becomes:

$V_{R0}lh=Ib0 \times R0-R0 \times C0 \times SlewRate lh.$

When VIN is going from high to low, the voltage across R0 becomes:

$V_{R0}hl=Ib0 \times R0+R0 \times C0 \times SlewRate hl.$

One advantage of this circuit is that it can be implemented using a low-voltage, low-power technology, while the signal VIN can be a large signal beyond the supply rails. As an example, let I0=40 uA, R0=40 kOhm, C0=100 fF, VIN swings high and low between 0 V and 10V in 25 nsec.

$$V_{R0}lh = 40u \times 40k - 40k \times 100f \times \frac{10}{25n} = 1.6 - 1.6 = 0$$

$$V_{R0}hl = 40u \times 40k + 40k \times 100f \times \frac{10}{25n} = 1.6 + 1.6 = 3.2 \text{ V}$$

Thus, $V_{R0}$lh varies between 0 V and 3.2 V, when VIN varies between 0 V and 10 V.

Figure 5:
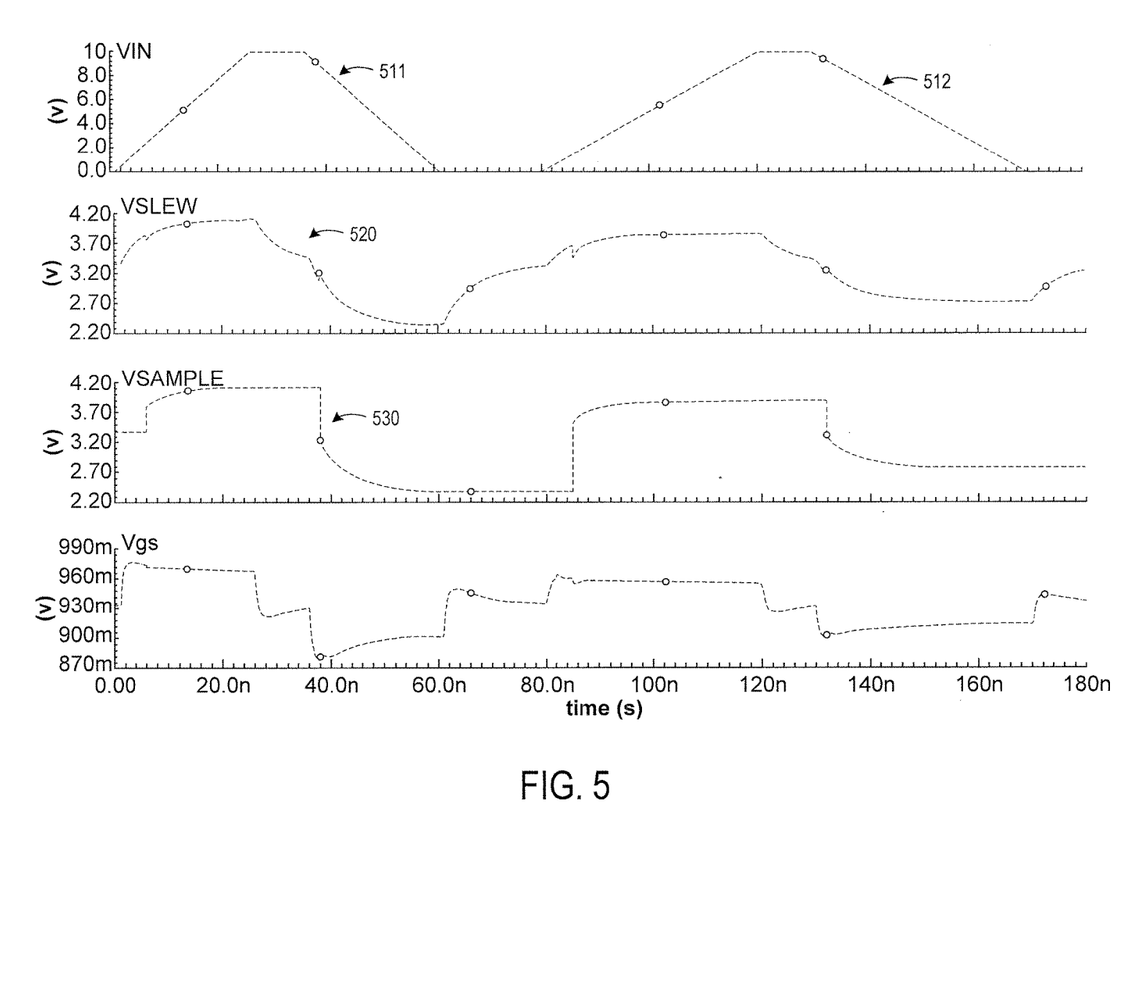
FIG. 5 is a waveform diagram illustrating simulated waveforms of signals at various nodes in the slew rate detection circuit of FIG. 4 according to an embodiment of the present invention.

FIG. 5 is a waveform diagram illustrating simulated waveforms of signals at various nodes in the slew rate detection circuit of FIG. 4. In FIG. 5, the horizontal axis shows measurement time from 0 nsec to 180 nsec, and the vertical axes show the magnitude of the signals in volts or millivolts. There are four waveforms in FIG. 5. The first waveform, with the vertical axis labeled VIN, is the input voltage VIN in FIG. 4. In can be seen that VIN includes two pulses; the first pulse 511 has a faster slew rate, and the second pulse 512 has a slower rate. As used herein, the slew rate of a signal refers to the change in the signal voltage divided by the time duration of the change. The first pulse 511 rises from 0 V to 10 V in about 25 nsec, from about 0 nsec to about 25 nsec. The first pulse then lowers from 10 V to 0 V in about 25 nsec. The second pulse 512 rises from 0 V to 10 V in about 40 nsec, from about 80 nsec to about 120 nsec. The second pulse 512 then drops from 10V to 0 V in about 40 nsec. The fourth waveform, labeled Vgs illustrates the gate-source voltage Vgs of transistor M1 in FIG. 4. It can be seen that Vgs varies between about 870 mV and 970 mV. Therefore, the range of variation of Vgs is about 100 mV when VIN varies by about 10 V. This satisfies the operating condition stated above, $\Delta Vgs \ll \Delta VIN$.

In FIG. 5, the second waveform 520, labeled VSLEW, illustrates the voltage on resistor R0 at node N1 in FIG. 4 just before the sampling switch. Initially, bias current Ib0 flows through R0, M3 and M1, and VSLEW is at about 3.40 V. At t=0 nsec, when VIN starts to ramp up, ramping current flows from VIN, through capacitor 0 to transistor M1. Since Ib0 is fixed by the current mirror, more current is supplied from Vdd through R0. Therefore, the voltage across R0, VSLEW, goes higher. At t=25 ns, VIN stops ramping, the extra current is not needed, the current in R0 drops back towards bias current Ib0, and VSLEW is also lowered. At about t=35 ns, VIN start to ramp down, and capacitor C0 discharges through M1, with current coming out of M3 the bias current source. As a result, VSLEW drops.

As input voltage VIN ramps up and down, the changes in VSLEW reflects the changes in the current through the path including resistor R0 and transistor M1, and reflects the slew rate of the input voltage. In the embodiment of FIG. 4, VSLEW is sampled by the sample-and hold circuit. In FIG. 5, the third waveform 530, labeled VSAMPLE, is the voltage on the sampling capacitor Cs of the sample-and-hold circuit in FIG. 4. When the sampling switch is closed, the capacitor holds the voltage. The voltage output from the sample-and-hold circuit represents the slew rate of the input signal and can be processed and used in various applications. For example, in FIG. 4, analog-to-digital converter (ADC) 440 is coupled to sample-and-hold circuit 430 to provide a digital representation of the slew rate Dout [N:0], where N is an integer.

In an alternative embodiment without an ADC, the slew rate detection circuit can also be implemented with comparators formed by reference circuits and latches for slew rate range indication. This could be used if the application requires the slew rate to be within a certain range or to be part of an up/down control for the slew rate control loop. An embodiment of such circuit is shown below.

Figure 6:
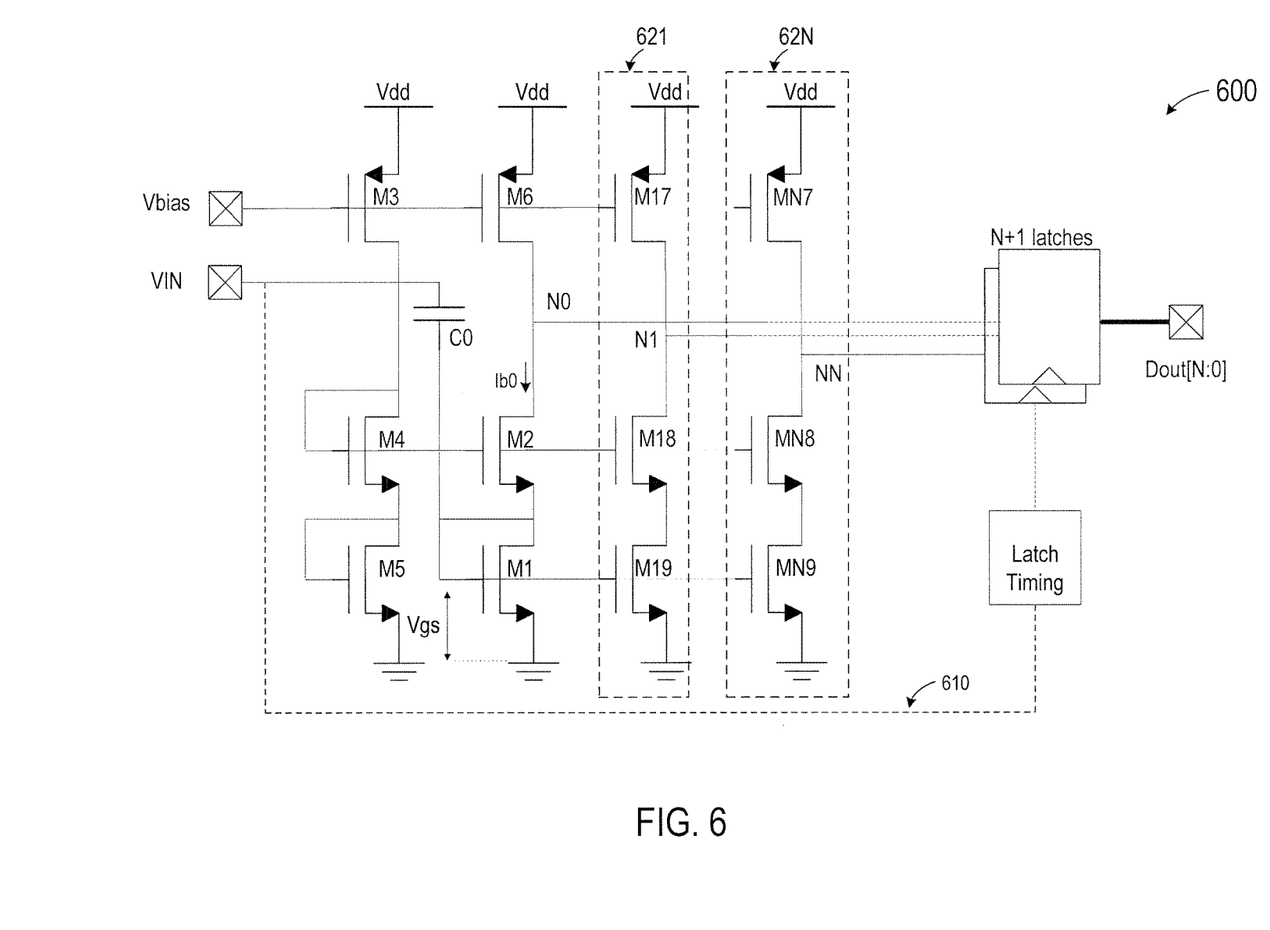
FIG. 6 is a schematic diagram illustrating a circuit for controlling a slew rate range according to another embodiment of the present invention.

FIG. 6 is a schematic diagram illustrating a circuit for controlling a slew rate range according to another embodiment of the present invention. As shown in FIG. 6, slew rate control circuit 600 includes a slew rate detection circuit as described above in connection with FIG. 4. The slew rate detection circuit includes a bias current transistor M3, which provides a bias current into diode-connected transistors M4 and M5. The gates of transistors M2 and M4 are tied together, which then results in a fixed ratio bias current Ib0 of M2 and diode-connected transistor M1. In FIG. 4, a resistor R0 is coupled to node N0 (corresponding to N1 in FIG. 4) for sampling the current to measure the slew rate. In FIG. 6, R0 is replaced by a transistor M6, and node N0 is coupled to the drain of M2 to provide a sampling node. Additionally, slew rate control circuit 600 also includes a plurality of reference circuits and latches to provide a digital representation of the slew rate. As shown in FIG. 6, each of N reference circuits 621-62N can be formed by a group of transistors M17, M18, and M19, through MN7, MN8, and MN9, which are configured to provide different thresholds for comparing signals at reference nodes N0, N1, ..., and NN, respectively. Further, N+1 Latches 660 are coupled to the reference circuits, and are configured to provide digital representation of the slew rate Dout [N:0], where N is an integer. This design for providing a digital output is simpler than the conventional analog-to-digital converter (ADC). The dotted line signal 610 is configured for the latch timing and ADC sample timing. Signal 610 is derived from VIN, which in turn is derived from the Class-D driver control. Therefore, it is a low voltage control signal that is phase aligned with the Class-D output signal.

It is noted that in the embodiments shown in FIGS. 4 and 6, NMOS transistors are used. However, it is understood that complimentary embodiments can be carried out using PMOS transistors, with known circuit techniques. For examples, polarities of the devices need to be adjusted, with power and ground terminal reversed, the resistor tied to ground, and the capacitor tied to a PMOS, etc.

While the above is a description of specific embodiments of the invention, the description should not be taken as limiting the scope of the invention. It is understood that the examples and embodiments described herein are for illustrative purposes only and that various modifications or changes can be made in light thereof.

What is claimed is:

1. A circuit for determining a slew rate of an input signal, comprising a capacitor connected between an input signal and a diode-connected first MOSFET (Metal-Oxide-Semiconductor Field Effect Transistor), wherein the capacitor is configured to carry a current proportional to the slew rate of the input signal, and wherein the current in the first MOSFET is equal to a sum of a constant bias current and a second current that is proportional to the slew rate of the input signal;

wherein the current in the first MOSFET is used to determine the slew rate of the input signal.

2. The circuit of claim 1, further comprising:

a resistor and a second MOSFET coupled with the first MOSFET in series between a power terminal and a ground terminal, the first MOSFET having a drain terminal, a gate terminal, and a source terminal, wherein a first end of the resistor is coupled to the power terminal, a second end of the resistor is coupled to a first end of the second MOSFET, a second end of the second MOSFET is coupled to the drain terminal of the first MOSFET, the source terminal of the first MOSFET is coupled to the ground terminal, and the second MOSFET is coupled to a bias circuit to provide a bias current;

wherein the capacitor has a first terminal and a second terminal, the first terminal coupled to the input signal and the second terminal coupled to the gate terminal and the drain terminal of the first MOSFET;

wherein the slew rate of the input signal is related to the current flowing through the resistor in response to changes in the input signal.

3. The circuit of claim 2, wherein the bias circuit comprises third, fourth, and fifth MOSFETs coupled in series between the power supply terminal and the ground terminal, wherein:

the third MOSFET is coupled to the power supply terminal and configured to receive a bias voltage;

the fourth and fifth MOSFETS are diode-connected;

the gate of the fourth MOSFET is coupled to the gate of the second MOSFET.

4. The circuit of claim 2, further comprising a sample-and-hold circuit, which includes a switch coupled to the first resistor and a capacitor coupled to the switch.

5. The circuit of claim 4, wherein the switch is coupled to a timing circuit that is coupled to the input signal.

6. The circuit of claim 4, further comprising an ADC (Analog-to-Digital Converter) coupled to the sample-and-hold circuit for providing a digital value representing the slew rate.

7. The circuit of claim 1, further comprising: a second MOSFET coupled to the drain terminal of the first MOSFET, the second MOSFET being coupled to a bias circuit to provide the bias current.

8. The circuit of claim 7, wherein the bias circuit comprises third, fourth, and fifth MOSFETs coupled in series between the power supply terminal and the ground terminal, wherein:

the third MOSFET is coupled to the power supply terminal and configured to receive a bias voltage;

the fourth and fifth MOSFETS are diode-connected;

the gate of the fourth MOSFET is coupled to the gate of the second MOSFET.

9. The circuit of claim 8, further comprising:

a sixth MOSFET coupled in series with the second MOSFET, a gate of the sixth MOSFET is coupled to the bias voltage, a drain of the sixth MOSFET is coupled to a sampling node for comparison with references nodes provided by a plurality of reference circuits;

wherein each of the plurality of references circuits includes seventh, eight, and ninth MOSFETs coupled in series between power and ground, wherein:

a gate of the seventh MOSFET is coupled to the bias voltage;

a gate of the eighth MOSFET is coupled to the gates of the second and fourth MOSFETs;

a gate of the ninth MOSFET is coupled to the gates of the first MOSFET; and a drain of the eighth MOSFET is coupled to a reference node configured for comparison with the sampling node.

10. A circuit for determining a slew rate of an input signal, comprising:

a capacitor connected between an input signal and a diode-connected first MOSFET (Metal-Oxide-Semiconductor Field Effect Transistor), wherein the first MOSFET is configured to carry a current during changes of an input signal, and the current is proportional to the slew rate of the input signal;

a bias circuit for providing a bias current through the first MOSFET;

a comparator configured for providing differential outputs based on the current through the first MOSFET and representing the slew rate.

11. The circuit of claim 10, further comprising a second MOSFET coupled to the drain terminal of the first MOSFET, the second MOSFET being coupled to a bias circuit to provide the bias current.

12. The circuit of claim 11, wherein the bias circuit comprises third, fourth, and fifth MOSFETs coupled in series between the power supply terminal and the ground terminal, wherein:

the third MOSFET is coupled to the power supply terminal and configured to receive a bias voltage;

the fourth and fifth MOSFETS are diode-connected;

the gate of the fourth MOSFET is coupled to the gate of the second MOSFET.

13. The circuit of claim 12, wherein the comparator comprises:

a sixth MOSFET coupled in series with the second MOSFET, a gate of the sixth MOSFET is coupled to the bias voltage;

seventh, eight, and ninth MOSFETs coupled in series between power and ground, wherein:

a gate of the seventh MOSFET is coupled to the bias voltage;

a gate of the eighth MOSFET is coupled to the gates of the second and fourth MOSFETs; and a gate of the ninth MOSFET is coupled to the gates of the first MOSFET.

14. The circuit of claim 13, further comprising a first latch coupled to a first node between the second and sixth MOSFET and a second latch coupled to a second node between the seventh and eighth MOSFET for providing slew rate control.

15. The circuit of claim 1, wherein the slew rate detection circuit is configured to operate at a voltage lower than the input voltage.

* * * * *